United States Patent [19]

Shimizu et al.

[11] Patent Number: 5,031,125

[45] Date of Patent: Jul. 9, 1991

[54] APPARATUS FOR MEASURING ELECTRON TEMPERATURE

[75] Inventors: Kazuo Shimizu, Kashiwa; Hiroshi Amemiya, Kawagoe; Yuichi Sakamoto, Tokyo, all of Japan

[73] Assignee: Rikagaku Kenkyusho, Japan

[21] Appl. No.: 334,200

[22] Filed: Apr. 6, 1989

[51] Int. Cl.$^5$ ............................................. G01K 11/00
[52] U.S. Cl. ..................................... 364/557; 374/163
[58] Field of Search .................. 364/550, 551.01, 557; 374/141, 163, 183

[56] References Cited

U.S. PATENT DOCUMENTS

| | | | |
|---|---|---|---|
| 4,133,700 | 1/1979 | Hollander et al. | 374/163 X |
| 4,211,113 | 7/1980 | Harrison | 364/557 X |
| 4,455,095 | 6/1984 | Bleiker | 364/557 X |
| 4,481,596 | 11/1984 | Townzen | 364/557 X |
| 4,528,637 | 7/1985 | Smith | 364/557 |
| 4,588,308 | 5/1986 | Saito | 364/557 X |
| 4,607,962 | 8/1986 | Nagao et al. | 364/557 X |
| 4,852,027 | 7/1989 | Bowman et al. | 364/557 |

OTHER PUBLICATIONS

Dr. Irving Langmuir and Harold Mott-Smith, Jr., General Electric Review vol. XXVII, No. 7 Jul. 1924, pp. 449-455, "Studies of Electric Discharges in Gases at Low Pressures".

Primary Examiner—Joseph L. Dixon
Attorney, Agent, or Firm—Brumbaugh, Graves, Donohue & Raymond

[57] ABSTRACT

Apparatus for measuring the electron temperature of plasma includes a first probe which is inserted in the plasma to detect the floating potential. Two sequentially generated pulses of distinct voltages are added to the detected floating potential and these summed voltages are then sequentially applied to the plasma via a second probe. The current in the second probe is detected and the electron temperature is then calculated from the values of the voltage pulses and the currents detected by the second probe.

3 Claims, 2 Drawing Sheets

APPARATUS FOR MEASURING ELECTRON TEMPERATURE

BACKGROUND OF THE INVENTION

This invention relates to an apparatus for measuring electron temperature in plasma and particularly to an apparatus for measuring electron temperature with high reliability and in a short time by inserting a probe into plasma.

FIG. 2 shows characteristics of probe current to probe voltage in the case that the distribution of velocity of electrons in plasma obeys Maxwell's distribution. FIG. 3 shows the characteristics using a log-scale for the current. The region where the voltage is lower than a floating potential $V_f$ at which the probe current is zero is the ion saturation current region, the region between the floating potential $V_f$ and the space potential as a turning point in FIG. 3 is the electron retarding region and the region where the voltage is higher than the space potential is the electron saturation current region. In the electron retarding region, the probe current is represented by the following equation:

$$ip = J \exp[-e(Vs - Vp)/kTe] \quad (1)$$

where ip is the probe current, Vp is the probe voltage, Vs is the space potential, e is charge on one electron, k is Boltzmann's constant, Te is electron temperature and J is the electron saturation current determined by the charge and mass of the electron, the shape of a probe electrode and the electron temperature and so forth.

From Eq. (1), with regard to the electron temperature Te, we can obtain the following equation:

$$Te = \frac{e}{k} \cdot \frac{\Delta Vp}{\Delta \log ip} \quad (2)$$

where $\Delta Vp$ is the difference of the probe voltages, $\Delta \log ip$ is the difference of logarithmic values of the probe currents while the probe voltage is varied by $\Delta Vp$.

Electron temperature has usually been obtained by a method (1) of measuring the characteristics of the logarithmic probe current to the probe voltage and reading the slope or a method (2) of superimposing an alternating voltage on the probe voltage, detecting change of the probe current and obtaining a ratio of a logarithmic value of the difference to the alternating voltage. However, method (1) needs long measuring times and human judgment and method (2) has a time lag due to the time delay and poor response of the detecting circuit. Method (2) also lacks reliability because the measurement region may go out of the electron retarding region. Moreover, methods (1) and (2) have a common problem in that only low temperature plasma is measurable and the measurable region of the temperature is narrow.

In general, the characteristics of the probe voltage to the current can be divided into the three regions, that is, the ion saturation current region, the electron retarding region and the electron saturation current region. It should be noted that Eq. (1) is satisfied only in the electron retarding region. In the other regions, the electron temperature obtained by Eq. (2) leads to a wrong result.

Conditions of plasma in either laboratry systems or industrial systems widely change depending on kinds of gases, pressure, discharge conditions and so forth. The changes of the plasma conditions influence the probe characteristics and result in a shift of the electron retarding region, change of the electron temperature and change of the density of the electrons.

SUMMARY OF THE INVENTION

The object of this invention is to restrict the measuring region to the electron retarding region and to provide an apparatus for changing the probe voltage in a short time and picking up a corresponding difference of the probe currents to measure the electron temperature with high reliability, in a short time and over a wide temperature range.

The above described problems are solved by premeasuring the floating potential and producing a probe voltage using the premeasured floating potential as a base, and more specifically, by this apparatus for measuring electron temperature comprising means for detecting a floating potential, pulse generating means, an adder means for adding the floating voltage detected by said floating voltage detecting means to the voltages of the pulses generated by said pulse generating means, a probe current detecting means for detecting probe currents which flow when output signals of said adder circuit are applied to a probe, and a processing means for processing the current signals detected by the probe current detecting means and the voltages of the pulses to obtain a value corresponding to the electron temperature.

In operation, the floating voltage which is a border between the ion saturation current region and the electron retarding region is detected, in the electron retarding region the probe voltage is changed in a short time, the probe current is detected and the electron temperature is obtained as a result of data processing. Therefore, this apparatus for measuring electron temperature carries out the measurement with high reliability and in a short time and also has a high generality allowing the measurement in high temperature plasma.

Figure 1:
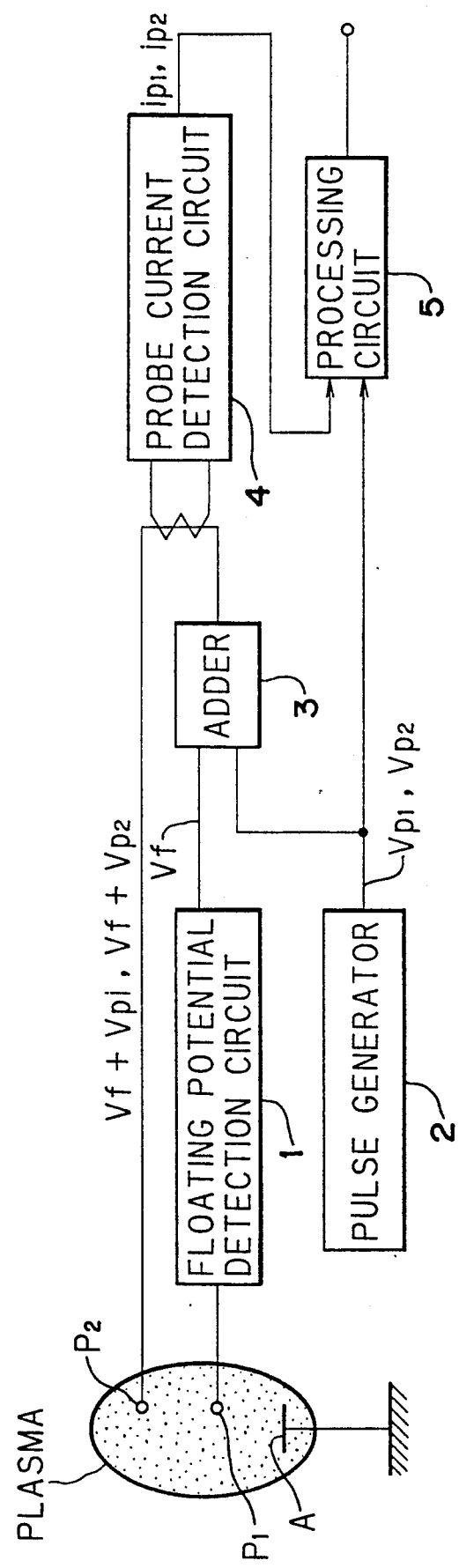
FIG. 1 shows a block diagram illustrating circuits for measuring electron temperature according to this invention.
Figure 2:
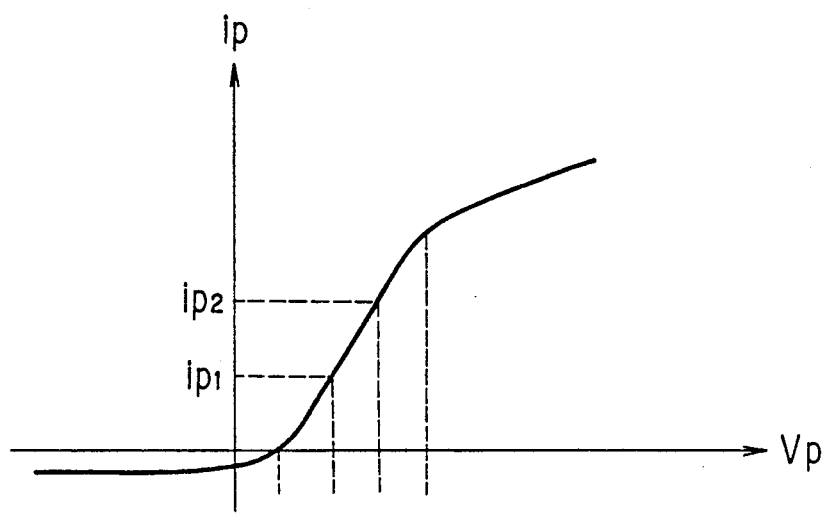
FIG. 2 shows probe characteristics (Vp−ip)
Figure 3:
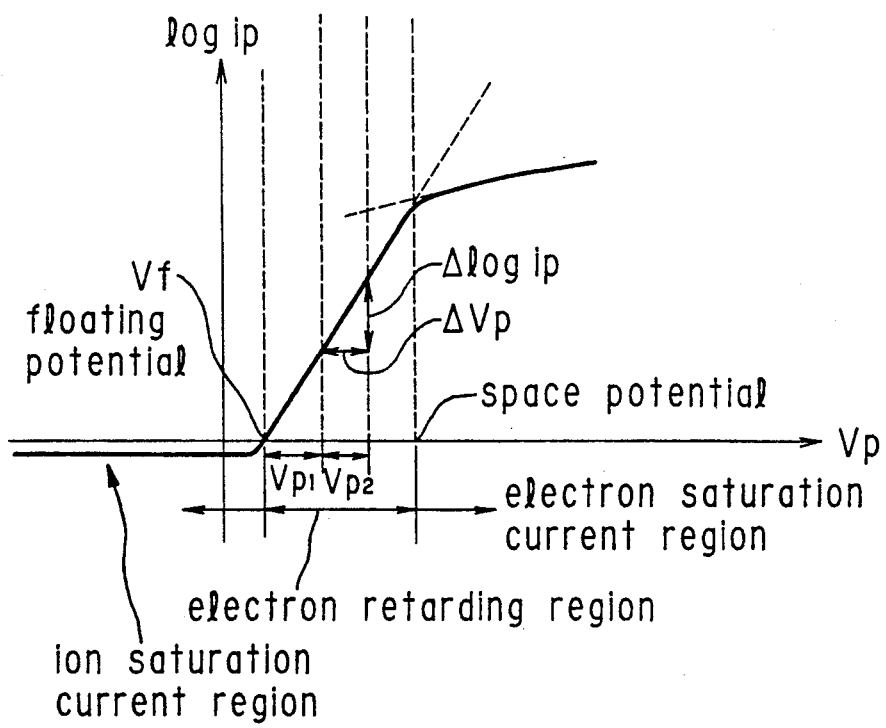
FIG. 3 shows probe characteristics (Vp−log ip).

Hereinbelow, we will explain an example of this invention with reference to the block diagram of FIG. 1 and the probe characteristics of FIGS. 2 and 3.

DESCRIPTION OF THE PREFERRED EMBODIMENT

A probe $P_1$ for detecting the floating potential and a probe $P_2$ for detecting probe currents are inserted in plasma. The voltage of the probe $P_1$ to the anode A where the probe current ip is zero, that is, the floating potential $V_f$ of the plasma indicated in FIGS. 2 and 3 is measured by a floating potential detection circuit 1. A pulse generator 2 sequentially generates pulses of two distinct kinds of voltages $V_{p1}$ and $V_{p2}$ which do not exceed the electron retarding region. These generated pulses of voltages $V_{p1}$ and $V_{p2}$ are added to the floating potential $V_f$ in an adder 3 and then the added value is supplied to the probe $P_2$. Probe currents $i_{p1}$ and $i_{p2}$ which are respectively generated by the applied voltages $V_f + V_{p1}$ and $V_f + V_{p2}$ are detected by a probe current detection circuit 4. A processing circuit 5 obtains $\Delta \log ip$ that is a differance between logarithmic values of the probe currents $i_{p1}$ and $i_{p2}$ and $\Delta V p$ that is the differance between the voltages $V_{p1}$ and $V_{p2}$ of the pulses, and then calculates a ratio of $\Delta \log ip$ to $\Delta Vp$ in order to produce an output corresponding to the electron temterature.

The width of the electron retarding region is known and hardly changes even if the electorn temperature varies. However, not only the floating potential but the space potential may be predetected so that the voltages of the pulses do not go out of the space potential and the probe voltages much more surely resides in the electron retarding region.

Although an embodiment of the invention have been described for purposes of illustration, various modification may be made without departing from the spirit and scope of the invention. Therefore, the invention should be limited only by the appended claims.

What is claimed is:

1. Apparatus for measuring electron temperature of plasma comprising:
    means including a first probe insertable in the plasma for detecting a floating potential $V_f$ that is the border between the ion saturation current region and the electron retarding region of the plasma,
    pulse generating means for sequentially generating pulses of two distinct voltages,
    adder means for adding the floating potential detected by said floating potential detecting means to voltages of the pulses generated by said pulse generating means to obtain an output signal,
    means including a second probe insertable in the plasma and coupled to said adder means for applying the output signal from said adder to said plasma,
    probe current detecting means coupled to said second probe for detecting probe current which flows when said output signal is applied to said second probe, and
    processing means for processing current signals detected by said probe current detecting means and the voltages of said pulses to obtain the electron temperature.

2. Apparatus as defined in claim 1, wherein said pulse generating means generates pulses of two distinct voltages $V_{p1}$ and $V_{p2}$ and said processing means obtains a signal $\Delta \log ip$ that represents the difference between logarithmic values of the probe currents $i_{p1}$ and $i_{p2}$, which are respectively generated by the applied voltages $V_f + V_{p1}$ and $V_f + V_{p2}$ and a signal $\Delta V_p$ that represents the difference between the voltages $V_{p1}$ and $V_{p2}$ of said pulses, and then calculates a ratio of the signal $\Delta \log i_p$ to the signal $\Delta V_p$.

3. Apparatus as defined in claim 1, wherein said apparatus further comprises means for detecting a space potential that is the border between the electron retarding region and the electron saturation current region of the plasma, and
    wherein the voltages of said pulses are set at values less than the difference between said floating potential and said space potential.

* * * * *